(12) United States Patent
Ma

(10) Patent No.: US 11,257,882 B2
(45) Date of Patent: Feb. 22, 2022

(54) ACTIVE-MATRIX ORGANIC LIGHT-EMITTING DIODE (AMOLED) DISPLAY MODULE

(71) Applicant: WUHAN CHINA STAR OPTOELECTRONICS SEMICONDUCTOR DISPLAY TECHNOLOGY CO., LTD., Hubei (CN)

(72) Inventor: Weixin Ma, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 410 days.

(21) Appl. No.: 16/461,832

(22) PCT Filed: Mar. 19, 2019

(86) PCT No.: PCT/CN2019/078757
§ 371 (c)(1),
(2) Date: May 17, 2019

(87) PCT Pub. No.: WO2020/098196
PCT Pub. Date: May 22, 2020

(65) Prior Publication Data
US 2021/0335973 A1    Oct. 28, 2021

(30) Foreign Application Priority Data

Nov. 15, 2018   (CN) .......................... 201811362086.7

(51) Int. Cl.
*H01L 27/32* (2006.01)
*H01L 51/52* (2006.01)

(52) U.S. Cl.
CPC ...... *H01L 27/3246* (2013.01); *H01L 27/3248* (2013.01); *H01L 27/3258* (2013.01);
(Continued)

(58) Field of Classification Search
CPC ............ H01L 27/3276; H01L 27/3246; H01L 51/5212; H01L 51/5228; H01L 27/3248; H01L 27/3258; H01L 27/3297
See application file for complete search history.

(56) References Cited

U.S. PATENT DOCUMENTS

2007/0045616 A1   3/2007 Tokuda et al.
2012/0162053 A1   6/2012 Lee et al.
(Continued)

FOREIGN PATENT DOCUMENTS

CN       1901221 A      1/2007
CN       102569675 A    7/2012
(Continued)

*Primary Examiner* — Scott B Geyer
(74) *Attorney, Agent, or Firm* — Hauptman Ham, LLP

(57) ABSTRACT

An active-matrix organic light-emitting diode (AMOLED) display module is provided. The cathode of the AMOLED display module is uniformly arranged in a display area of an entire panel through a second conductive layer. Consequently, a common ground voltage signal (VSS) can be uniformly introduced onto the cathode so that each OLED element can receive a consistent common ground voltage signal (VSS) through the cathode.

9 Claims, 4 Drawing Sheets

(52) U.S. Cl.
CPC ...... *H01L 27/3276* (2013.01); *H01L 51/5212* (2013.01); *H01L 51/5228* (2013.01)

(56) References Cited

U.S. PATENT DOCUMENTS

| | | | |
|---|---|---|---|
| 2014/0264315 A1 | 9/2014 | Ono et al. | |
| 2014/0312323 A1* | 10/2014 | Park | H01L 51/525 |
| | | | 257/40 |
| 2016/0359136 A1 | 12/2016 | Song | |
| 2017/0069698 A1* | 3/2017 | Oh | H01L 27/3248 |
| 2017/0170246 A1* | 6/2017 | Im | H01L 51/5228 |
| 2017/0338438 A1* | 11/2017 | Kwon | H01L 27/3258 |
| 2017/0373130 A1* | 12/2017 | Lee | H01L 51/5228 |
| 2018/0102499 A1* | 4/2018 | Pyo | H01L 51/5056 |
| 2018/0145119 A1 | 5/2018 | Choi et al. | |
| 2018/0331169 A1* | 11/2018 | Nam | H01L 27/124 |
| 2019/0074338 A1* | 3/2019 | Gu | H01L 51/5228 |
| 2019/0348627 A1* | 11/2019 | Lee | H01L 51/56 |
| 2020/0273928 A1 | 8/2020 | Che et al. | |

FOREIGN PATENT DOCUMENTS

| | | |
|---|---|---|
| CN | 103907397 A | 7/2014 |
| CN | 103943649 A | 7/2014 |
| CN | 104393188 A | 3/2015 |
| CN | 107230692 A | 10/2017 |
| CN | 108292488 A | 7/2018 |
| KR | 102067968 B1 | 1/2020 |

\* cited by examiner

ACTIVE-MATRIX ORGANIC LIGHT-EMITTING DIODE (AMOLED) DISPLAY MODULE

FIELD OF INVENTION

The instant disclosure generally relates to the active-matrix organic light-emitting diode (AMOLED) display technology and, more particularly, to an AMOLED display module with a uniform cathode voltage.

BACKGROUND OF INVENTION

Compared with the liquid crystal display (LCD) technology, the AMOLED display technology has advantages of self-luminescence, wide viewing angle, high luminance, high luminous efficiency, small thickness, high picture contrast, fast response, etc. The AMOLED display technology has been widely used in various electronic display devices to enhance the product performance and the consumer experience.

In the structure of a conventional AMOLED display panel 600 as shown in FIG. 1 and FIG. 2, a first metal conductive layer 610 and a common ground (VSS) portion 602 are formed on an interlayer dielectric (ILD) layer 608. An insulating planarization (PLN) layer 612 is formed on the first metal conductive layer 610 and the common ground portion 602. An anode 604 is disposed in a through hole in the planarization layer 612, and a metal connection portion 616 connecting the common ground portion 602 is formed on the planarization layer 612. A pixel defining layer (PDL) 614 is formed on the anode 604, and the pixel defining layer 614 covers a portion of the metal connection portion 616. An OLED element 618 is disposed in a pre-determined position in the pixel defining layer 614. A second metal conductive layer 620 corresponding to the OLED element 618 is formed on the pixel defining layer 614. A full-surface cathode 606 is formed on the second metal conductive layer 620 and extends to a position where the metal connection portion 616 is electrically connected thereto so that the cathode 606 can be electrically connected to the common ground portion 602 through the metal connection portion 616.

The electrodes at both ends of each OLED element 618 are applied with a voltage at the anode 604 of a lower array structure and a common ground voltage (VSS) at the cathode 606 to form a voltage difference so that a current flows from the anode 604 of the array structure through the OLED element 618 to the cathode 606 to excite the OLED element 618 to illuminate. The cathode 606 in the AMOLED display panel 600 in FIG. 1 is a full-surface magnesium-aluminum alloy film, in which the VSS voltage signal at the cathode 606 is drawn from the metal connection portion 616 at the edge of the array structure. Therefore, the VSS voltage signal at the cathode 606 has a poor voltage uniformity at the central portion and the edge portion of the AMOLED display panel 600, thereby affecting the uniformity of display performance of the AMOLED display device.

Therefore, there is a need to provide a novel AMOLED display technology to improve the uniformity of the cathode voltage signal as well as the uniformity of display performance, and to overcome the defects of the prior art.

SUMMARY OF INVENTION

It is one object of the present invention to provide a method and a device for luminance adjustment for a display panel, which is capable of increasing the aperture ratio while improving the luminance uniformity of the display panel.

In order to solve the problems in the prior art, one object of the instant disclosure is to provide a cathode of an AMOLED display module uniformly arranged in a display area of an entire panel using a second conductive layer. Consequently, a common ground voltage signal (VSS) can be uniformly introduced onto the cathode so that each OLED element can receive a consistent common ground voltage signal (VSS) through the cathode. As a result, the voltage difference between the operating voltage (VDD) and the common ground voltage signal (VSS) across each OLED element is consistent, and the luminance of each OLED element can be kept uniform.

To achieve the foregoing object, the instant disclosure provides an AMOLED display module, which includes an interlayer dielectric (ILD) layer, a first conductive layer formed on the interlayer dielectric (ILD) layer; a first planarization layer formed on the first conductive layer and the interlayer dielectric (ILD) layer, in the first planarization layer being formed an opening for circuit connection in a position corresponding to the first conductive layer; a second conductive layer formed on the first planarization layer; a second planarization layer formed on the first planarization layer and the second conductive layer, in the second planarization layer being formed an opening for circuit connection in a position corresponding to the first conductive layer and an opening for circuit connection in a position corresponding to the second conductive layer; an anode formed in a position on the second planarization layer corresponding to the opening corresponding to the first conductive layer, the anode and the first conductive layer being electrically connected; a circuit connection portion formed in a position on the second planarization layer corresponding to the opening corresponding to the second conductive layer, the circuit connection portion and the second conductive layer being electrically connected; a pixel defining layer formed on the anode, the circuit connection portion, and the second planarization layer, in the pixel defining layer being formed an opening for circuit connection in a position corresponding to the anode and an opening for circuit connection in a position corresponding to the circuit connection portion; an organic light-emitting diode (OLED) element disposed in a position in the pixel defining layer corresponding to the opening corresponding to the anode, a positive end of the OLED element and the anode being electrically connected; a third conductive layer formed in a position on the pixel defining layer corresponding to the OLED element, the third conductive layer and a negative end of the OLED element being electrically connected; and a cathode formed on the pixel defining layer and the third conductive layer, the cathode extending to a position corresponding to the opening in the pixel defining layer corresponding to the circuit connection portion, the cathode electrically connecting the circuit connection portion and the third conductive layer.

In one embodiment of the instant disclosure, the cathode is disposed in a full-surface configuration or correspondingly disposed only in a location where the OLED element is connected thereto.

In one embodiment of the instant disclosure, the anode and the circuit connection portion are made in the same process.

In one embodiment of the instant disclosure, the first conductive layer, the second conductive layer and the third conductive layer are made of metal.

In one embodiment of the instant disclosure, the anode is made of transparent colorless indium-tin oxide (ITO).

In one embodiment of the instant disclosure, the interlayer dielectric (ILD) layer is made of polyimide (PI).

Compared with the prior art, in one embodiment of the instant disclosure, the cathode of an AMOLED display module is uniformly arranged in a display area of an entire panel using a second conductive layer. Consequently, a common ground voltage signal (VSS) can be uniformly introduced onto the cathode so that each OLED element can receive a consistent common ground voltage signal (VSS) through the cathode. As a result, the voltage difference between the operating voltage (VDD) and the common ground voltage signal (VSS) across each OLED element is consistent, the luminance of each OLED element can be kept uniform, and the luminance uniformity in the display area of the panel can be improved, so as to enhance the picture quality of the AMOLED display module as well as the consumer experience.

DESCRIPTION OF DRAWINGS

In order to more clearly illustrate the embodiments or the technical solutions in the prior art, the drawings used in the embodiments or the prior art description will be briefly described below. Obviously, the drawings in the following description are only some implementations of the instant disclosure. For example, other drawings may be obtained, without creative efforts, by those of ordinary skill in the art in light of the inventive work.

DETAILED DESCRIPTION OF PREFERRED EMBODIMENTS

The reference to "embodiment(s)" in the detailed description indicates that a particular feature, structure or characteristic described in connection with the embodiment(s) may be included in at least one embodiment of the instant disclosure. The same terms appearing in different paragraphs in the specification are not necessarily limited to the same implementation, but should be understood as independent or alternative implementations to other embodiments. In view of the technical solutions disclosed in the embodiments of the instant disclosure, those skilled in the art should understand that the embodiments described in the instant disclosure may have other combinations or modifications in accordance with the embodiments of the instant disclosure.

The following descriptions of the various embodiments with reference to the accompanying drawings exemplify particular embodiments of the instant disclosure. The directional terms mentioned in the instant disclosure, such as "upper", "lower", "front", "rear", "left", "right", "inner", "outer", "side", "vertical", "horizontal", etc., only illustrate the directions in the accompanying drawings. Therefore, the directional terms are used for the purpose of illustration and understanding of the instant disclosure, instead of limiting the instant disclosure.

Figure 1:
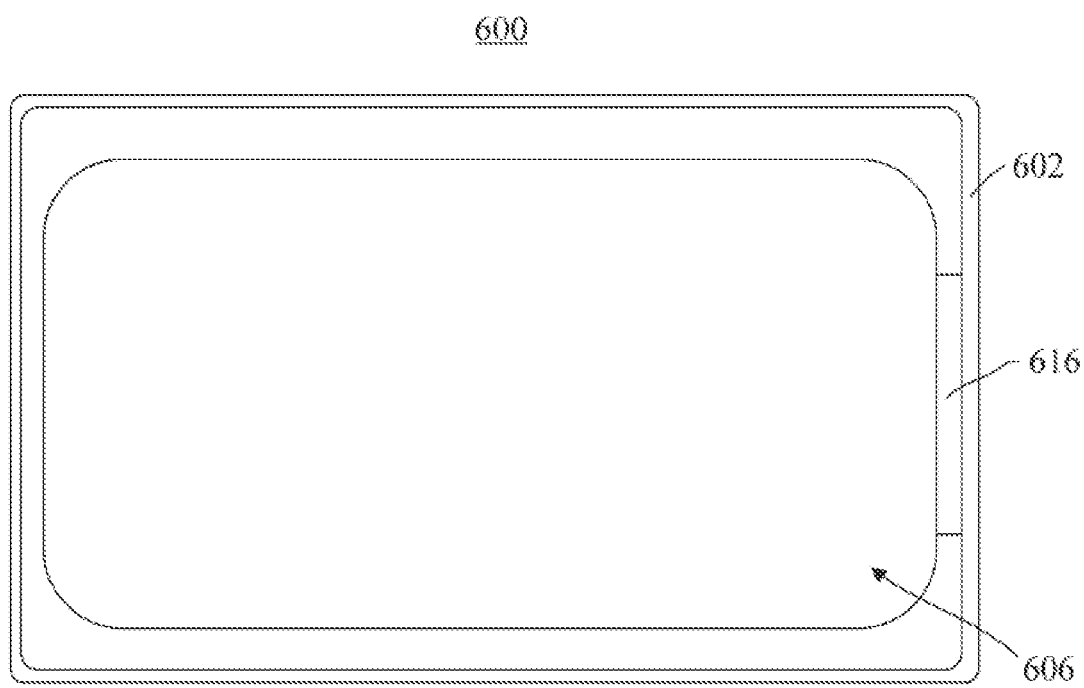
FIG. 1 is a schematic view showing a cathode arrangement structure of a conventional active-matrix organic light-emitting diode (AMOLED) display module.
Figure 2:
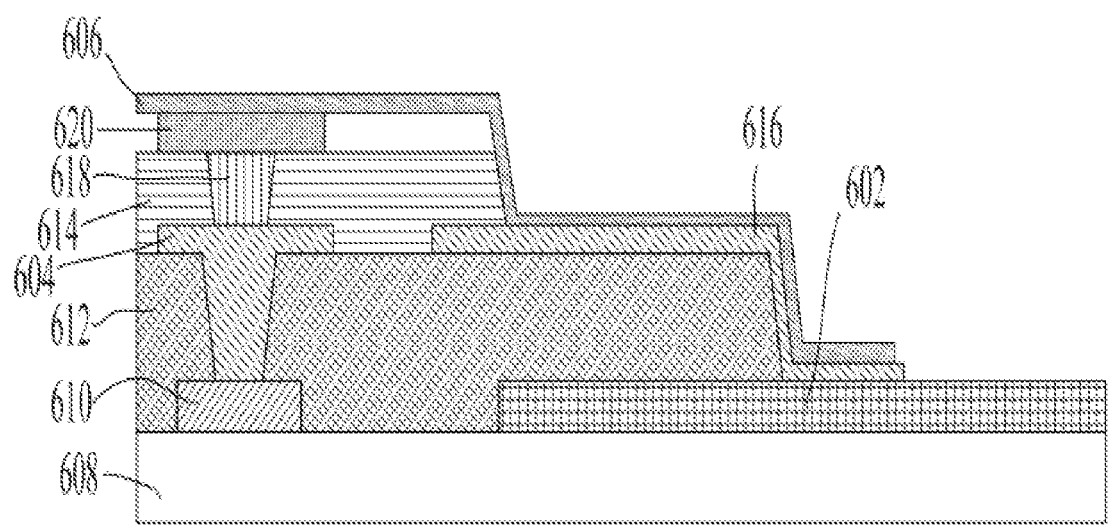
FIG. 2 is a cross-sectional view of a conventional active-matrix organic light-emitting diode (AMOLED) display module.
Figure 3:
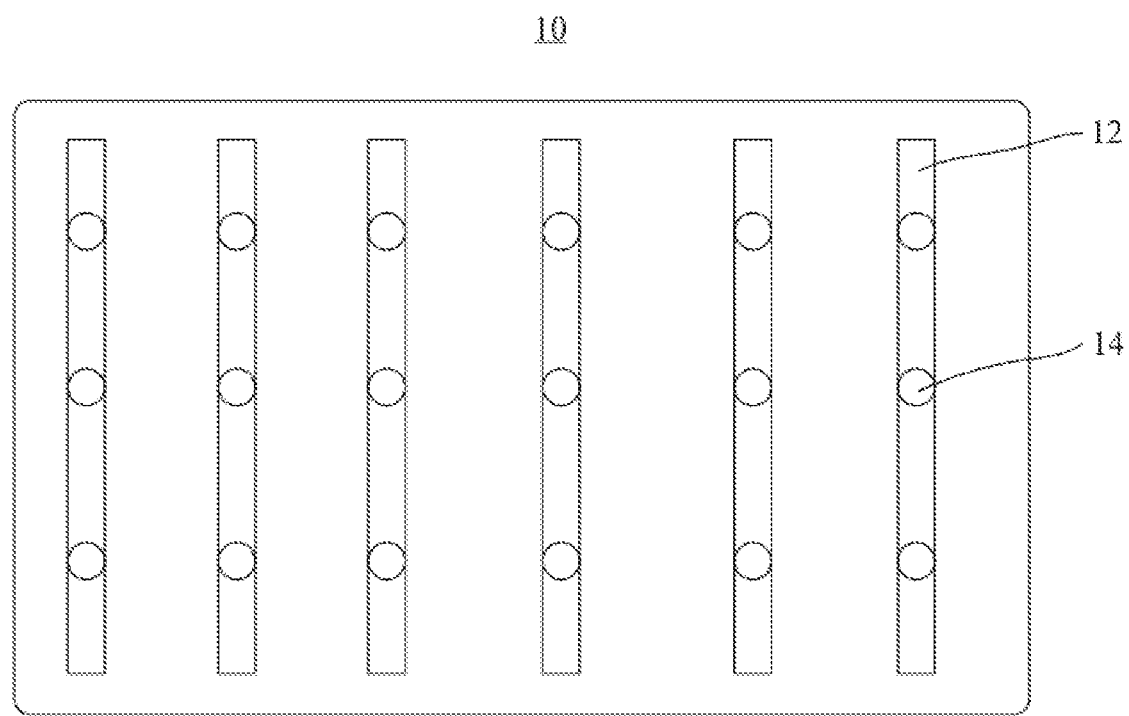
FIG. 3 is a schematic view showing a cathode arrangement structure of an active-matrix organic light-emitting diode (AMOLED) display module according to one embodiment of the instant disclosure.

FIG. 3 is a schematic view showing a cathode arrangement structure of an active-matrix organic light-emitting diode (AMOLED) display module according to one embodiment of the instant disclosure. As shown in FIG. 3, the AMOLED display module includes a panel 10. A cathode 12 on the panel 10 is connected to a common ground voltage signal (VSS) through a second conductive layer 14. Since the second conductive layer 14 is uniformly arranged in a display area of the entire panel 10, the common ground voltage signal (VSS) on the cathode 12 is uniformly distributed throughout the panel 10.

Figure 4:
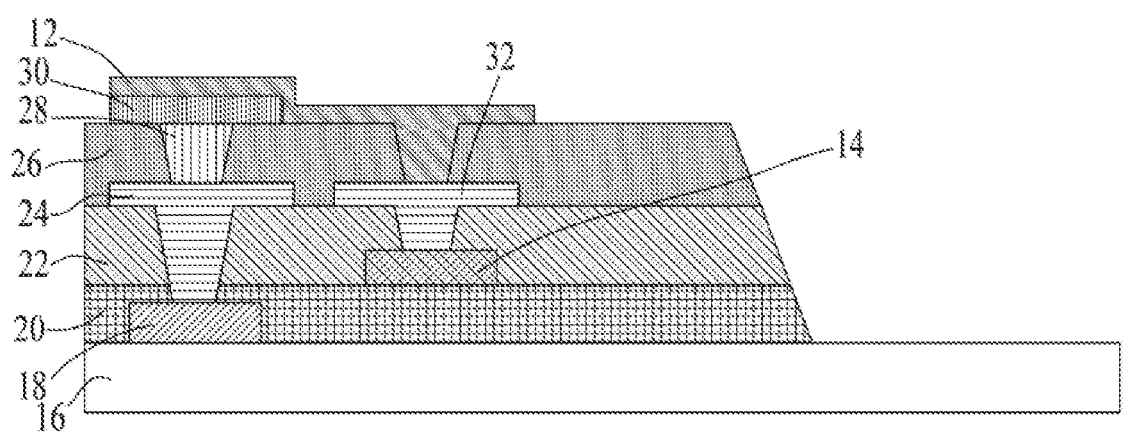
FIG. 4 is a cross-sectional view of an active-matrix organic light-emitting diode (AMOLED) display module according to one embodiment of the instant disclosure.

FIG. 4 is a cross-sectional view of an active-matrix organic light-emitting diode (AMOLED) display module according to one embodiment of the instant disclosure. As shown in FIG. 4, in the structure of the AMOLED display module, a first conductive layer 18 is formed on an interlayer dielectric (ILD) layer 16. A first planarization (PLN) layer 20 is formed on the first conductive layer 18 and the interlayer dielectric (ILD) layer 16. In the first planarization layer 20 is formed an opening for circuit connection in a position corresponding to the first conductive layer 18. A second conductive layer 14 is formed on the first planarization layer 20. A second planarization layer 22 is formed on the first planarization layer 20 and the second conductive layer 14. In the second planarization layer 22 are formed an opening for circuit connection in a position corresponding to the first conductive layer 18 and an opening for circuit connection in a position corresponding to the second conductive layer 14. An anode 24 is formed in a position on the second planarization layer 22 corresponding to the opening corresponding to the first conductive layer 18. A circuit connection portion 32 is formed in a position on the second planarization layer 22 corresponding to the opening corresponding to the second conductive layer 14. A pixel defining layer (PDL) 26 is formed on the anode 24, the circuit connection portion 32, and the second planarization layer 22. In the pixel defining layer 26 are formed an opening for circuit connection in a position corresponding to the anode 24 and an opening for circuit connection in a position corresponding to the circuit connection portion 32. An organic light-emitting diode (OLED) element 28 is disposed in a position in the pixel defining layer 26 corresponding to the opening corresponding to the anode 24. A third conductive layer 30 is formed in a position on the pixel defining layer 26 corresponding to the OLED element 28. A cathode 12 is formed on the pixel defining layer 26 and the third conductive layer 30. The cathode 12 extends to a position corresponding to the opening in the pixel defining layer 26 corresponding to the circuit connection portion 32 such that the cathode 12 and the circuit connection portion 32 are electrically connected.

In one embodiment of the instant disclosure, the anode 24 and the circuit connection portion 32 are made in the same process. Optionally, the first conductive layer 18, the second conductive layer 14, and the third conductive layer 30 are made of metal. Optionally, the anode 24 is made of transparent colorless indium tin oxide (ITO). Optionally, the interlayer dielectric (ILD) layer 16 may be made of polyimide (PI).

In one embodiment of the instant disclosure, in the structure of the AMOLED display module, the positive end of the OLED element 28 is electrically connected to the first conductive layer 18 through the anode 24 to provide the OLED element 28 with an operating voltage (VDD). The negative end of the OLED element 28 is electrically connected to the cathode 12 through the third conductive layer 30. The cathode 12 is electrically connected to a common ground voltage signal (VSS) through the second conductive layer 14 and the circuit connection portion 32 so that the OLED element 28 can emit light when it is turned on.

In one embodiment of the instant disclosure, the cathode 12 on the panel 10 is disposed in a full-surface configuration or correspondingly disposed only in a location where the OLED element 28 is connected thereto. Since the second conductive layer 14 is uniformly arranged in a display area of the entire panel 10, the common ground voltage signal (VSS) is uniformly introduced onto the cathode 12 so that each OLED element 28 can receive a consistent common ground voltage signal (VSS) through the cathode 12. As a result, the voltage difference between the operating voltage (VDD) and the common ground voltage signal (VSS) across each OLED element 28 is consistent, the luminance of each OLED element 28 can be kept uniform, and the luminance uniformity in the display area of the panel 10 can be improved, so as to enhance the picture quality of the AMOLED display module.

In one embodiment of the instant disclosure, the cathode of an AMOLED display module is uniformly arranged in a display area of an entire panel using a second conductive layer. Consequently, a common ground voltage signal (VSS) can be uniformly introduced onto the cathode so that each OLED element can receive a consistent common ground voltage signal (VSS) through the cathode. As a result, the voltage difference between the operating voltage (VDD) and the common ground voltage signal (VSS) across each OLED element is consistent, the luminance of each OLED element can be kept uniform, and the luminance uniformity in the display area of the panel can be improved, so as to enhance the picture quality of the AMOLED display module as well as the consumer experience.

In summary, although the instant disclosure has been disclosed in the above preferred embodiments, the preferred embodiments are not intended to limit the instant disclosure. Various modifications may be made by those with ordinary skill in the art without departing from the spirit and scope of the instant disclosure. Changes and modifications are intended to be included within the scope of the instant disclosure as defined by the appended claims.

What is claimed is:

1. An active-matrix organic light-emitting diode (AMOLED) display module, comprising:
   an interlayer dielectric (ILD) layer;
   a first conductive layer formed on the interlayer dielectric (ILD) layer;
   a first planarization layer formed on the first conductive layer and the interlayer dielectric (ILD) layer, wherein in the first planarization layer is formed an opening for circuit connection in a position corresponding to the first conductive layer;
   a second conductive layer formed on the first planarization layer;
   a second planarization layer formed on the first planarization layer and the second conductive layer, wherein in the second planarization layer are formed an opening for circuit connection in a position corresponding to the first conductive layer and an opening for circuit connection in a position corresponding to the second conductive layer;
   an anode formed in a position on the second planarization layer corresponding to the opening corresponding to the first conductive layer, the anode and the first conductive layer being electrically connected;
   a circuit connection portion formed in a position on the second planarization layer corresponding to the opening corresponding to the second conductive layer, the circuit connection portion and the second conductive layer being electrically connected;
   a pixel defining layer formed on the anode, the circuit connection portion, and the second planarization layer, wherein in the pixel defining layer are formed an opening for circuit connection in a position corresponding to the anode and an opening for circuit connection in a position corresponding to the circuit connection portion;
   an organic light-emitting diode (OLED) element disposed in a position in the pixel defining layer corresponding to the opening corresponding to the anode, a positive end of the OLED element and the anode being electrically connected;
   a third conductive layer formed in a position on the pixel defining layer corresponding to the OLED element, the third conductive layer and a negative end of the OLED element being electrically connected; and
   a cathode formed on the pixel defining layer and the third conductive layer, the cathode extending to a position corresponding to the opening in the pixel defining layer corresponding to the circuit connection portion, wherein the cathode electrically connects the circuit connection portion and the third conductive layer,
   wherein there are multiple ones of the second conductive layer, and the second conductive layers are uniformly arranged in the AMOLED display module.

2. The AMOLED display module of claim 1, wherein the second conductive layer is electrically connected to a common ground voltage signal (VSS).

3. The AMOLED display module of claim 1, wherein the first conductive layer is electrically connected to an operating voltage (VDD).

4. The AMOLED display module of claim 1, wherein the cathode is disposed in a full-surface configuration in the AMOLED display module.

5. The AMOLED display module of claim 1, wherein the cathode is correspondingly disposed only in a location where the OLED element is connected thereto.

6. The AMOLED display module of claim 1, wherein the first conductive layer, the second conductive layer and the third conductive layer are made of metal.

7. The AMOLED display module of claim 1, wherein the anode is made of transparent colorless indium-tin oxide (ITO).

8. The AMOLED display module of claim 1, wherein the anode and the circuit connection portion are made in the same process.

9. The AMOLED display module of claim 1, wherein the interlayer dielectric (ILD) layer is made of polyimide (PI).

* * * * *